(12) United States Patent
Jeon

(10) Patent No.: US 10,290,331 B1
(45) Date of Patent: *May 14, 2019

(54) METHOD AND SYSTEM FOR MODULATING READ OPERATIONS TO SUPPORT ERROR CORRECTION IN SOLID STATE MEMORY

(71) Applicant: EMC IP Holding Company LLC, Hopkinton, MA (US)

(72) Inventor: Seungjune Jeon, Santa Clara, CA (US)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/581,191

(22) Filed: Apr. 28, 2017

(51) Int. Cl.
| | | |
|---|---|---|
| *G11C 7/00* | (2006.01) |
| *G11C 7/22* | (2006.01) |
| *G11C 29/50* | (2006.01) |
| *G11C 16/34* | (2006.01) |
| *G11C 16/04* | (2006.01) |

(52) U.S. Cl.
CPC ............ *G11C 7/00* (2013.01); *G11C 16/0408* (2013.01); *G11C 16/3459* (2013.01); *G11C 29/50016* (2013.01)

(58) Field of Classification Search
CPC . G11C 7/00; G11C 29/50016; G11C 16/3495; G11C 16/0408
See application file for complete search history.

(56) References Cited

U.S. PATENT DOCUMENTS

| | | | |
|---|---|---|---|
| 6,016,275 A | 1/2000 | Han |
| 6,862,675 B1 | 3/2005 | Wakimoto |
| 7,559,004 B1 | 7/2009 | Chang et al. |
| 8,189,379 B2 | 5/2012 | Camp et al. |
| 8,259,506 B1 | 9/2012 | Sommer et al. |
| 8,305,812 B2 | 11/2012 | Levy et al. |
| 8,335,893 B2 | 12/2012 | Tagawa |
| 8,694,724 B1 | 4/2014 | Linnell et al. |
| 8,819,503 B2 | 8/2014 | Melik-Martirosian |

(Continued)

FOREIGN PATENT DOCUMENTS

| | | |
|---|---|---|
| CN | 102150140 A | 8/2011 |
| CN | 103902234 A | 7/2014 |

(Continued)

OTHER PUBLICATIONS

Hyojin Choi et al.; "VLSI Implementation of BCH Error Correction for Multilevel Cell NAND Flash Memory"; IEEE Transactions on Very Large Scale Integration (VLSI) Systems; vol. 18, No. 5; pp. 843-847; May 2010 (5 pages).

(Continued)

*Primary Examiner* — Toan K Le
(74) *Attorney, Agent, or Firm* — Chamberlain, Hrdlicka, White, Williams & Aughtry

(57) ABSTRACT

In general, embodiments of the technology relate to improving read performance of solid-state storage by using decoding schemes deemed particularly suitable for the read operation that is currently being performed. More specifically, embodiments of the technology relate to using program/erase (P/E) cycle values, retention times, and page numbers in order to determine the appropriate decoding parameters to use when reading data that has been previously stored in the solid-state storage.

20 Claims, 9 Drawing Sheets

(56) References Cited

U.S. PATENT DOCUMENTS

| | | | |
|---|---|---|---|
| 8,868,842 | B2 | 10/2014 | Yano et al. |
| 8,891,303 | B1 | 11/2014 | Higgins et al. |
| 8,934,284 | B2 | 1/2015 | Patapoutian et al. |
| 8,995,197 | B1 | 3/2015 | Steiner et al. |
| 9,026,764 | B2 | 5/2015 | Hashimoto |
| 9,095,586 | B2 | 8/2015 | Hillis et al. |
| 9,330,767 | B1 | 5/2016 | Steiner et al. |
| 9,368,225 | B1 * | 6/2016 | Pinkovich ........... G11C 11/5642 |
| 9,496,043 | B1 | 11/2016 | Camp et al. |
| 9,564,233 | B1 | 2/2017 | Cho et al. |
| 9,606,737 | B2 | 3/2017 | Kankani et al. |
| 9,645,177 | B2 * | 5/2017 | Cohen ................ G11C 16/0483 |
| 9,690,655 | B2 * | 6/2017 | Tabrizi ............... G06F 11/1072 |
| 9,710,180 | B1 | 7/2017 | Van Gaasbeck |
| 9,740,425 | B2 | 8/2017 | Bakshi et al. |
| 9,798,334 | B1 | 10/2017 | Tabrizi et al. |
| 9,842,060 | B1 | 12/2017 | Jannyavula Venkata et al. |
| 9,864,525 | B2 | 1/2018 | Kankani et al. |
| 9,891,844 | B2 | 2/2018 | Kankani et al. |
| 9,905,289 | B1 * | 2/2018 | Jeon .................... G11C 11/4096 |
| 2005/0172082 | A1 | 8/2005 | Liu et al. |
| 2005/0223185 | A1 | 10/2005 | Lee |
| 2005/0278486 | A1 | 12/2005 | Trika et al. |
| 2007/0260811 | A1 | 11/2007 | Merry, Jr. et al. |
| 2007/0263444 | A1 | 11/2007 | Gorobets et al. |
| 2007/0266200 | A1 | 11/2007 | Gorobets et al. |
| 2008/0082725 | A1 | 4/2008 | Elhamias |
| 2008/0082726 | A1 | 4/2008 | Elhamias |
| 2009/0144598 | A1 | 6/2009 | Yoon et al. |
| 2010/0306577 | A1 | 12/2010 | Dreifus et al. |
| 2010/0306580 | A1 | 12/2010 | McKean et al. |
| 2010/0332923 | A1 | 12/2010 | D'Abreu |
| 2011/0173484 | A1 | 7/2011 | Schuette et al. |
| 2011/0202818 | A1 | 8/2011 | Yoon et al. |
| 2012/0110239 | A1 | 5/2012 | Goss et al. |
| 2012/0192035 | A1 | 7/2012 | Nakanishi |
| 2012/0236656 | A1 | 9/2012 | Cometti |
| 2012/0239991 | A1 | 9/2012 | Melik-Martirosian |
| 2012/0268994 | A1 | 10/2012 | Nagashima |
| 2012/0290899 | A1 | 11/2012 | Cideciyan |
| 2013/0019057 | A1 | 1/2013 | Stephens |
| 2013/0047044 | A1 | 2/2013 | Weathers et al. |
| 2013/0094286 | A1 | 4/2013 | Sridharan et al. |
| 2013/0151214 | A1 | 6/2013 | Ryou |
| 2013/0176784 | A1 | 7/2013 | Cometti et al. |
| 2013/0185487 | A1 | 7/2013 | Kim et al. |
| 2013/0227200 | A1 | 8/2013 | Cometti et al. |
| 2013/0311712 | A1 | 11/2013 | Aso |
| 2014/0006688 | A1 | 1/2014 | Yu et al. |
| 2014/0101499 | A1 | 4/2014 | Griffin |
| 2014/0181378 | A1 | 6/2014 | Saeki et al. |
| 2014/0181595 | A1 | 6/2014 | Hoang et al. |
| 2014/0195725 | A1 | 7/2014 | Bennett |
| 2014/0208174 | A1 | 7/2014 | Ellis et al. |
| 2014/0215129 | A1 | 7/2014 | Kuzmin et al. |
| 2014/0229799 | A1 | 8/2014 | Hubris |
| 2014/0293699 | A1 | 10/2014 | Yang et al. |
| 2014/0347936 | A1 | 11/2014 | Ghaly |
| 2014/0359202 | A1 | 12/2014 | Sun et al. |
| 2014/0365836 | A1 | 12/2014 | Jeon et al. |
| 2015/0078094 | A1 | 3/2015 | Nagashima |
| 2015/0082121 | A1 | 3/2015 | Wu et al. |
| 2015/0227418 | A1 | 8/2015 | Cai et al. |
| 2015/0357045 | A1 | 12/2015 | Moschiano et al. |
| 2016/0004464 | A1 | 1/2016 | Shen |
| 2016/0092304 | A1 * | 3/2016 | Tabrizi ................ G06F 11/1072 714/6.24 |
| 2016/0093397 | A1 | 3/2016 | Tabrizi et al. |
| 2016/0148708 | A1 | 5/2016 | Tuers et al. |
| 2016/0306591 | A1 | 10/2016 | Ellis et al. |
| 2016/0342345 | A1 | 11/2016 | Kankani et al. |
| 2017/0090783 | A1 | 3/2017 | Fukutomi et al. |
| 2017/0109040 | A1 | 4/2017 | Raghu et al. |
| 2017/0228180 | A1 | 8/2017 | Shen |
| 2017/0235486 | A1 | 8/2017 | Martineau et al. |
| 2017/0262336 | A1 | 9/2017 | Tabrizi et al. |
| 2017/0315753 | A1 | 11/2017 | Blount |
| 2018/0018269 | A1 | 1/2018 | Jannyavula Venkata et al. |
| 2018/0032439 | A1 | 2/2018 | Jenne et al. |
| 2018/0034476 | A1 | 2/2018 | Kayser et al. |
| 2018/0039795 | A1 | 2/2018 | Gulati |
| 2018/0060230 | A1 | 3/2018 | Kankani et al. |

FOREIGN PATENT DOCUMENTS

| | | |
|---|---|---|
| JP | 2011-100519 A | 5/2011 |
| JP | 2012-203957 A | 10/2012 |
| JP | 2013176784 A | 9/2013 |

OTHER PUBLICATIONS

Te-Hsuan Chen et al.; "An Adaptive-Rate Error Correction Scheme for NAND Flash Memory"; 27th IEEE VLSI Test Symposium; pp. 53-58; 2009 (6 pages).

Eran Gal et al.; "Algorithms and Data Structures for Flash Memories"; ACM Computing Surveys (CSUR); vol. 37, No. 2; pp. 138-163; Jun. 2005 (30 pages).

Mendel Rosenblum et al.; "The Design and Implementation of a Log-Structured File System"; ACM Transactions on Computer Systems; vol. 10; No. 1; pp. 26-52; Feb. 1992 (27 pages).

Chanik Park et al.; "A Reconfigurable FTL (Flash Translation Layer) Architecture for NAND Flash-Based Applications"; ACM Transactions on Embedded Computing Systems; vol. 7, No. 4, Article 38; Jul. 2008 (23 pages).

Yu Cai et al.; "Flash Correct-and-Refresh: Retention-Aware Error Management for Increased Flash Memory Lifetime"; Proceedings of the IEEE International Conference on Computer Design (ICCD); pp. 94-101; 2012 (10 pages).

Beomkyu Shin et al.; "Error Control Coding and Signal Processing for Flash Memories"; IEEE International Symposium on Circuits and Systems (ISCAS); pp. 409-412; 2012 (4 pages).

Haleh Tabrizi et al.; "A Learning-based Network Selection Method in Heterogeneous Wireless Systems"; IEEE Global Telecommunications Conference (GLOBECOM 2011); 2011 (5 pages).

Neal Mielke et al.; "Recovery Effects in the Distributed Cycling of Flash Memories"; IEEE 44th Annual International Reliability Physics Symposium; pp. 29-35; 2006 (7 pages).

Ramesh Pyndiah et al.; "Near Optimum Decoding of Product Codes"; Global Telecommunicaitons Conference (GLOBECOM '94), Communications: The Global Bridge pp. 339-343; 1994 (5 pages).

Junsheng Han et al.; "Reliable Memories with Subline Accesses"; International Symposium on Information Theory (ISIT); pp. 2531-2535, Jun. 2007 (5 pages).

Ankit Singh Rawat et al.; "Locality and Availability in Distributed Storage," arXiv:1402.2011v1 [cs.IT]; Feb. 10, 2014 (9 pages).

Parikshit Gopalan et al.; "On the Locality of Codeword Symbols"; arXiv:1106.3625v1[cs.IT]; Jun. 18, 2011 (17 pages).

Frédérique Oggier et al.; "Self-repairing Homomorphic Codes for Distributed Storage Systems"; IEEE INFOCOM 2011; pp. 1215-1223; 2011 (9 pages).

Dimitris Papailiopoulos et al.; "Simple Regenerating Codes: Network Coding for Cloud Storage"; arXiv:1109.0264v1 [cs.IT]; Sep. 1, 2011 (9 pages).

Osama Khan et al.; "In Search of I/O—Optimal Recovery from Disk Failures"; HotStorage 2011; Jun. 2011 (5 pages).

Cheng Huang et al.; "Pyramid Codes: Flexible Schemes to Trade Space for Access Efficiency in Reliable Data Storage Systems"; Sixth IEEE International Symposium on Network Computing and Applications (NCA); 2007 (8 pages).

Hongchao Zhou et al.; "Error-Correcting Schemes with Dynamic Thresholds in Nonvolatile Memories"; 2011 IEEE International Symposium on Information Theory Proceedings; pp. 2143-2147; 2011; (5 pages).

Borja Peleato et al.; "Towards Minimizing Read Time for NAND Flash"; Globecom 2012—Symposium on Selected Areas in Communication; pp. 3219-3224; 2012 (6 pages).

(56) References Cited

OTHER PUBLICATIONS

Yongjune Kim et al.; "Modulation Coding for Flash Memories"; 2013 International Conference on Computing, Networking and Communications, Data Storage Technology and Applications Symposium; pp. 961-967; 2013 (7 pages).

Yu Cai et al.; "Program Interference in MLC NAND Flash Memory: Characterization, Modeling, and Mitigation"; 2013 IEEE International Conference on Computer Design (ICCD); pp. 123-130; 2013 (8 pages).

Yu Cai et al.; "Threshold Voltage Distribution in MLC NAND Flash Memory: Characterization, Analysis, and Modeling"; Proceedings of the Conference on Design, Automation and Test in Europe; pp. 1285-1290; 2013 (6 pages).

Eitan Yaakobi et al.; Error Characterization and Coding Schemes for Flash Memories; IEEE Globecom 2010 Workshop on Application of Communication Theory to Emerging Memory Technologies; pp. 1856-1860; 2010 (5 pages).

Borja Peleato et al.; "Maximizing MLC NAND lifetime and reliability in the presence of write noise"; IEEE International Conference on Communications (ICC); pp. 3752-3756; 2012 (5 pages).

Feng Chen et al.; "Essential Roles of Exploiting Internal Parallelism of Flash Memory based Solid State Drives in High-Speed Data Processing"; 2011 IEEE 17th International Symposium on High Performance Computer Architecture (HPCA); pp. 266-277; 2011.

\* cited by examiner

METHOD AND SYSTEM FOR MODULATING READ OPERATIONS TO SUPPORT ERROR CORRECTION IN SOLID STATE MEMORY

BACKGROUND

One important performance metric for a storage system is the read performance, including the latency and error rate related to retrieving data stored in the storage system. The performance of the storage system improves with a decrease in the read latency. The read latency for a storage system may be decreased if the storage system is able to reliably retrieve error-free data from the storage medium.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-7, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to improving read performance of solid-state storage by using decoding schemes deemed particularly suitable for the read operation that is currently being performed. More specifically, embodiments of the technology relate to using program/erase (P/E) cycle values, retention times, and page numbers in order to determine the appropriate decoding parameters to use when reading data that has been previously stored in the solid-state storage. The ability to dynamically change the decoding parameters on a per read request basis allows for more error-free data to be retrieved from the solid-state storage and/or for a reduction in the latency that results from overly complex and potentially unnecessary decoding schemes. As a result, the overall performance of the system may increase.

The following description describes one or more systems and methods for implementing one or more embodiments of the technology.

Figure 1A:
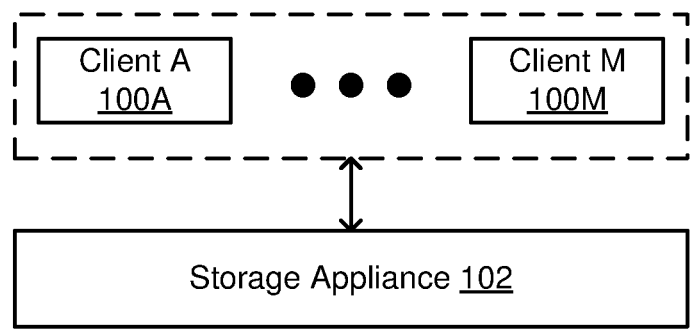
FIGS. 1A-1C show systems in accordance with one or more embodiments of the technology.
Figure 1B:
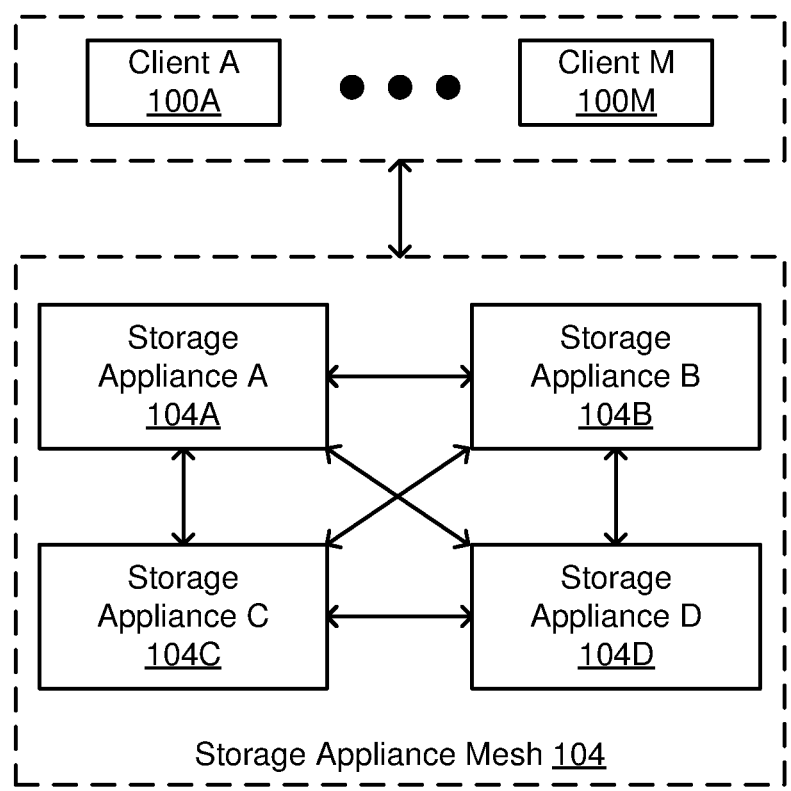
Figure 1C:
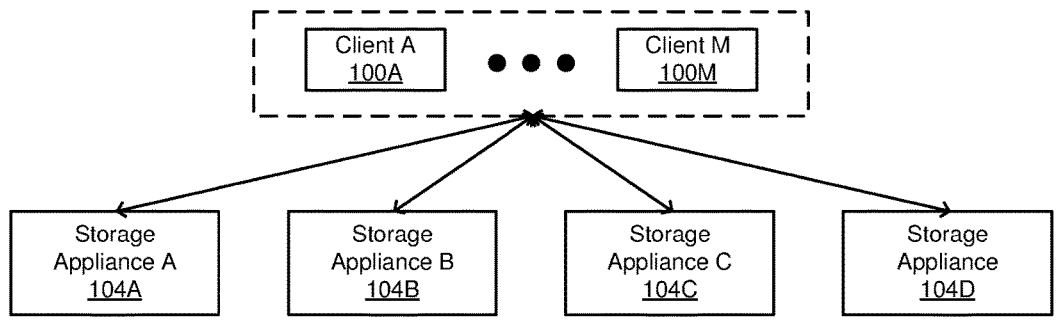

FIGS. 1A-1C show systems in accordance with one or more embodiments of the technology. Referring to FIG. 1A, the system includes one or more clients (client A (100A), client M (100M)) operatively connected to a storage appliance (102).

In one embodiment of the technology, clients (100A, 100M) correspond to any physical system that includes functionality to issue a read request to the storage appliance (102) and/or issue a write request to the storage appliance (102). Though not shown in FIG. 1A, each of the clients (100A, 100M) may include a client processor (not shown), client memory (not shown), and any other software and/or hardware necessary to implement one or more embodiments of the technology.

In one embodiment of the technology, the client (100A-100M) is configured to execute an operating system (OS) that includes a file system. The file system provides a mechanism for the storage and retrieval of files from the storage appliance (102). More specifically, the file system includes functionality to perform the necessary actions to issue read requests and write requests to the storage appliance. The file system also provides programming interfaces to enable the creation and deletion of files, reading and writing of files, performing seeks within a file, creating and deleting directories, managing directory contents, etc. In addition, the file system also provides management interfaces to create and delete file systems. In one embodiment of the technology, to access a file, the operating system (via the file system) typically provides file manipulation interfaces to open, close, read, and write the data within each file and/or to manipulate the corresponding metadata.

Continuing with the discussion of FIG. 1A, in one embodiment of the technology, the clients (100A, 100M) are configured to communicate with the storage appliance (102) using one or more of the following protocols: Peripheral Component Interconnect (PCI), PCI-Express (PCIe), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one embodiment of the technology, the storage appliance (102) is a system that includes volatile and persistent storage and is configured to service read requests and/or write requests from one or more clients (100A, 100M). Various embodiments of the storage appliance (102) are described below in FIG. 2.

Referring to FIG. 1B, FIG. 1B shows a system in which clients (100A, 100M) are connected to multiple storage appliances (104A, 104B, 104C, 104D) arranged in a mesh configuration (denoted as storage appliance mesh (104) in FIG. 1B). As shown in FIG. 1B, the storage appliance mesh (104) is shown in a fully-connected mesh configuration— that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, each of the clients (100A, 100M) may be directly connected to one or more storage appliances (104A, 104B, 104C, 104D) in the storage appliance mesh (104). Those skilled in the art will appreciate that the storage appliance mesh may be implemented using other mesh configurations (e.g., partially connected mesh) without departing from the technology.

Referring to FIG. 1C, FIG. 1C shows a system in which clients (100A, 100M) are connected to multiple storage appliances (104A, 104B, 104C, 104D) arranged in a fan-out configuration. In this configuration, each client (100A, 100M) is connected to one or more of the storage appliances (104A, 104B, 104C, 104D); however, there is no communication between the individual storage appliances (104A, 104B, 104C, 104D).

Those skilled in the art will appreciate that while FIGS. 1A-1C show storage appliances connected to a limited number of clients, the storage appliances may be connected to any number of clients without departing from the technology. Those skilled in the art will appreciate that while FIGS. 1A-1C show various system configurations, the technology is not limited to the aforementioned system configurations. Further, those skilled in the art will appreciate that the clients (regardless of the configuration of the system) may be connected to the storage appliance(s) using any other physical connection without departing from the technology.

Figure 2:
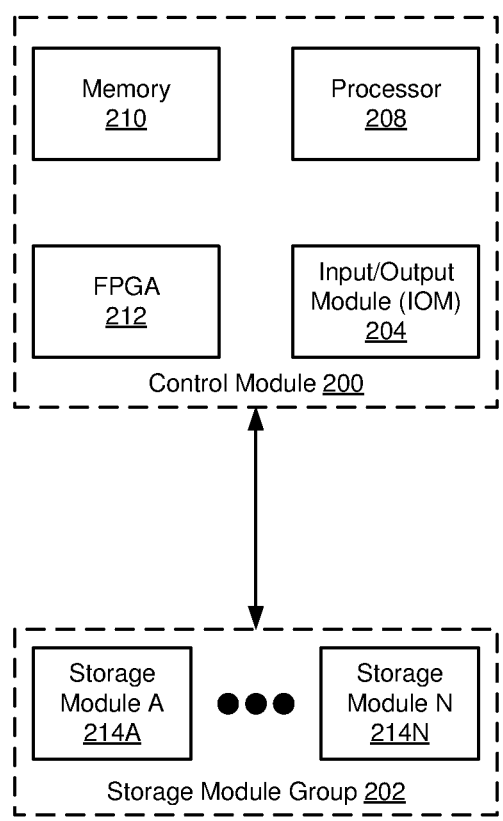
FIG. 2 shows storage appliances in accordance with one or more embodiments of the technology.

FIG. 2 shows embodiments of a storage appliance in accordance with one or more embodiments of the technology. The storage appliance includes a control module (200) and a storage module group (202). Each of these components is described below. In general, the control module (200) is configured to manage the servicing of read and write requests from one or more clients. In particular, the control module is configured to receive requests from one or more clients via the input/output module (IOM, 204, discussed below), to process the request (which may include sending the request to the storage module), and to provide a response to the client after the request has been serviced. Additional details about the components in the control module are included below. Further, the operation of the control module with respect to servicing read requests is described below with reference to FIGS. 6A and 6B.

Continuing with the discussion of FIG. 2, in one embodiment of the technology, the control module (200) includes an Input/Output Module (IOM) (204), a processor (208), a memory (210), and, optionally, a Field Programmable Gate Array (FPGA) (212). In one embodiment of the technology, the IOM (204) is the physical interface between the clients (e.g., 100A, 100M in FIGS. 1A-1C) and the other components in the storage appliance. The IOM supports one or more of the following protocols: PCI, PCIe, PCI-X, Ethernet (including, but not limited to, the various standards defined under the IEEE 802.3a-802.3bj), Infiniband, and Remote Direct Memory Access (RDMA) over Converged Ethernet (RoCE). Those skilled in the art will appreciate that the IOM may be implemented using protocols other than those listed above without departing from the technology.

Continuing with FIG. 2, the processor (208) is a group of electronic circuits with a single core or multi-cores that are configured to execute instructions. In one embodiment of the technology, the processor (208) may be implemented using a Complex Instruction Set (CISC) Architecture or a Reduced Instruction Set (RISC) Architecture. In one or more embodiments of the technology, the processor (208) includes a root complex (as defined by the PCIe protocol). In one embodiment of the technology, if the control module (200) includes a root complex (which may be integrated into the processor (208)) then the memory (210) is connected to the processor (208) via the root complex. Alternatively, the memory (210) is directly connected to the processor (208) using another point-to-point connection mechanism. In one embodiment of the technology, the memory (210) corresponds to any volatile memory including, but not limited to, Dynamic Random-Access Memory (DRAM), Synchronous DRAM, SDR SDRAM, and DDR SDRAM.

In one embodiment of the technology, the processor (208) is configured to create and update an in-memory data structure (not shown), where the in-memory data structure is stored in the memory (210). In one embodiment of the technology, the in-memory data structure includes information described in FIG. 4.

In one embodiment of the technology, the processor is configured to offload various types of processing to the FPGA (212), in scenarios in which the FPGA is present. In one embodiment of the technology, the FPGA (212) includes functionality to calculate checksums for data that is being written to the storage module(s) and/or data that is being read from the storage module(s). Further, the FPGA (212) may include functionality to calculate P and/or Q parity information for purposes of storing data in the storage module(s) using a RAID scheme (e.g., RAID 2-RAID 6) and/or functionality to perform various calculations necessary to recover corrupted data stored using a RAID scheme (e.g., RAID 2-RAID 6). In one embodiment of the technology, the storage module group (202) includes one or more storage modules (214A, 214N) each configured to store data. One embodiment of a storage module is described below in FIG. 3.

Figure 3:
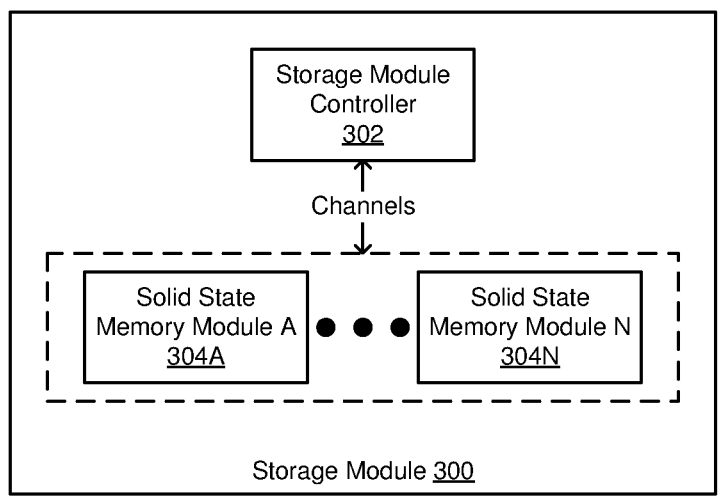
FIG. 3 shows a storage module in accordance with one or more embodiments of the technology.

FIG. 3 shows a storage module in accordance with one or more embodiments of the technology. The storage module (300) includes a storage module controller (302), memory (not shown), and one or more solid-state memory modules (304A, 304N). Each of these components is described below.

In one embodiment of the technology, the storage module controller (300) is configured to receive requests to read from and/or write data to one or more control modules. Further, the storage module controller (300) is configured to service the read and write requests using the memory (not shown) and/or the solid-state memory modules (304A, 304N).

In one embodiment of the technology, the memory (not shown) corresponds to any volatile memory including, but not limited to, Dynamic Random-Access Memory (DRAM), Synchronous DRAM, SDR SDRAM, and DDR SDRAM.

In one embodiment of the technology, the solid-state memory modules correspond to any data storage device that uses solid-state memory to store persistent data. In one embodiment of the technology, solid-state memory may include, but is not limited to, NAND Flash memory and NOR Flash memory. Further, the NAND Flash memory and the NOR flash memory may include single-level cells (SLCs), multi-level cell (MLCs), or triple-level cells (TLCs). Those skilled in the art will appreciate that embodiments of the technology are not limited to storage class memory.

Figure 4:
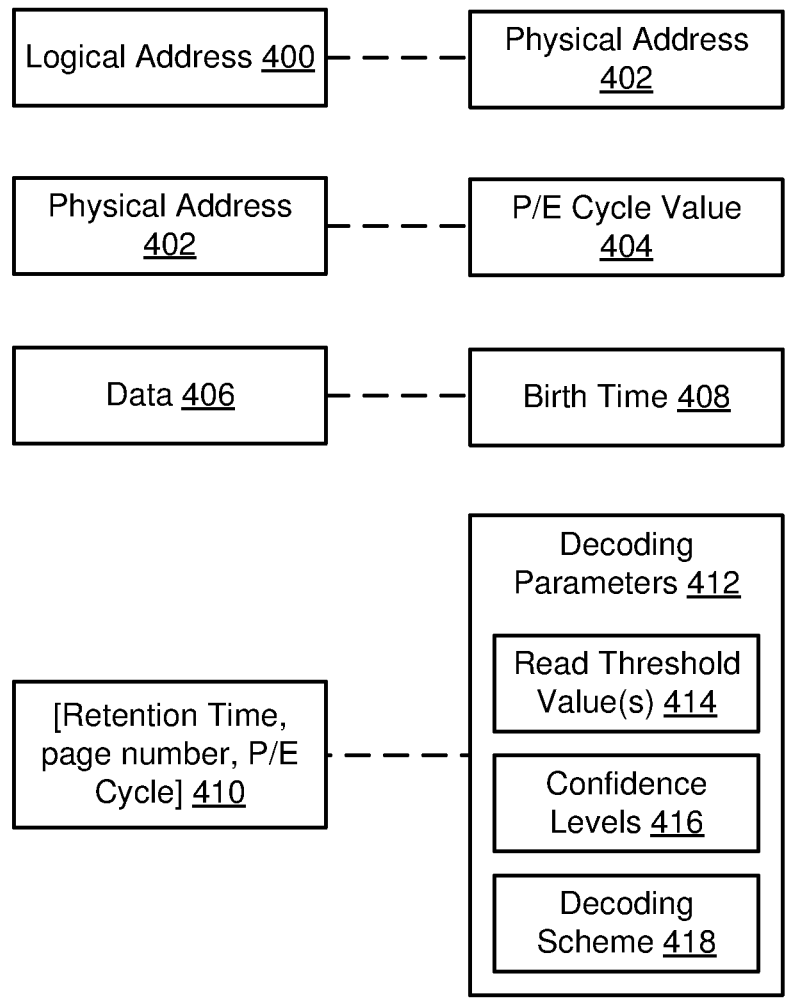
FIG. 4 shows the relationship between various components in accordance with one or more embodiments of the technology.

FIG. 4 shows the relationship between various components in accordance with one or more embodiments of the technology. More specifically, FIG. 4 shows the various types of information that is stored in the memory of the control module. Further, the control module includes functionality to update the information stored in the memory of the control module. The information described below may be stored in one or more in-memory data structures. Further, any data structure type (e.g., arrays, linked lists, hash tables, etc.) may be used to organize the following information within the in-memory data structure(s) provided that the data structure type(s) maintains the relationships (as described below) between the information.

The memory includes a mapping of logical addresses (400) to physical addresses (402). In one embodiment of the technology, the logical address (400) is an address at which the data appears to reside from the perspective of the client (e.g., 100A, 100M in FIG. 1A). Said another way, the logical address (400) corresponds to the address that is used by the file system on the client when issuing a read request to the storage appliance.

In one embodiment of the technology, the logical address is (or includes) a hash value generated by applying a hash function (e.g., SHA-1, MD-5, etc.) to an n-tuple, where the n-tuple is <object ID, offset ID>. In one embodiment of the technology, the object ID defines a file and the offset ID defines a location relative to the starting address of the file. In another embodiment of the technology, the n-tuple is <object ID, offset ID, birth time>, where the birth time corresponds to the time when the file (identified using the object ID) was created. Alternatively, the logical address may include a logical object ID and a logical byte address, or a logical object ID and a logical address offset. In another embodiment of the technology, the logical address includes an object ID and an offset ID. Those skilled in the art will appreciate that multiple logical addresses may be mapped to a single physical address and that the logical address content and/or format is not limited to the above embodiments.

In one embodiment of the technology, the physical address (402) corresponds to a physical location in a solid-state memory module (304A, 304N) in FIG. 3. In one embodiment of the technology, the physical address is defined as the following n-tuple: <storage module, channel, chip enable, LUN, plane, block, page number, byte>.

In one embodiment of the technology, each physical address (402) is associated with a program/erase (P/E) cycle value (404). The P/E cycle value may represent: (i) the number of P/E cycles that have been performed on the physical location defined by the physical address or (ii) a P/E cycle range (e.g., 5,000-9,999 P/E cycles), where the number of P/E cycles that have been performed on the physical location defined by the physical address is within the P/E cycle range. In one embodiment of the technology, a P/E cycle is the writing of data to one or more pages in an erase block (i.e., the smallest addressable unit for erase operations, typically, a set of multiple pages) and the erasure of that block, in either order.

The P/E cycle values may be stored on a per page basis, a per block basis, on a per set of blocks basis, and/or at any other level of granularity. The control module includes functionality to update, as appropriate, the P/E cycle values (402) when data is written to (and/or erased from) the solid-state storage modules.

In one embodiment of the technology, all data (i.e., data that the file system on the client has requested be written to solid-state storage modules) (406) is associated with a birth time (408). The birth time (408) may correspond to: (i) the time the data is written to a physical location in a solid-state storage module (as a result of client write request, as a result of a garbage collection operation initiated by the control module, etc.); (ii) the time that the client issued a write request to write the data to a solid-state storage module; or (iii) a unitless value (e.g., a sequence number) that corresponds to the write events in (i) or (ii).

In one embodiment of the technology, the in-memory data structure includes a mapping of <retention time, page number, P/E cycle value> to a set of decoding parameters (412). The aforementioned mapping may further include any other system parameter(s) (i.e., one or more parameters in addition to retention time, page number, P/E cycle value) that affects the read threshold (e.g., temperature, workload, etc.). In one embodiment of the technology, the retention time corresponds to the time that has elapsed between the writing of the data to a physical location in a solid-state storage module and the time that the data is being read from the same physical location in the solid-state storage module. The retention time may be expressed in units of time or may be expressed as a unitless value (e.g., when the birth time is expressed as a unitless value). In one embodiment of the technology, the P/E cycle value in <retention time, page number, P/E cycle value> may be expressed as a P/E cycle or a P/E cycle range.

In one embodiment of the technology, the decoding parameters (412) include one or more read threshold value(s) (414), confidence levels (416) and a decoding scheme (418) to be applied to bit values that were obtained from performing a read operation using the read threshold value(s) (414). The read threshold value(s) (414) may be voltages or a shift value, where the shift value corresponds to a voltage shift of a default read threshold value. Each of the read threshold values may be expressed as a voltage or as a unitless number that corresponds to a voltage.

In one embodiment of the technology, the default read threshold value is specified by the manufacturer of the solid-state memory modules. Further, the granularity of the shift values may be specified by the a shift value, where the shift value corresponds to a voltage shift of a corresponding default read threshold value.

In one embodiment of the technology, the read threshold values (including the default read threshold values) correspond to voltage values that are used to read data stored in solid-state storage modules. More specifically, in one embodiment of the technology, the logical value (e.g., 1 or 0 for memory cells that are SLCs or 00, 10, 11, 01 for memory cells that are MLCs) is determined by comparing the voltage in the memory cell to one or more read threshold values. The logical value stored in the memory cell may then be ascertained based the results of the comparison. For example, if a given voltage (V) is above the read threshold, then the logical value stored in the memory cell is 0, whereas it is 1 if the voltage is above the read threshold. In one embodiment of the technology, each page in the solid-state memory module may include between 4-8 kB of data. Accordingly, the storage module controller typically obtains logical values from multiple memory cells in order to service a read request. The specific number of memory cells from which logical values must be obtained varies based upon the amount of data that is being requested (via the read request) and the type of memory cell (SLC, MLC, etc.).

In one embodiment of the technology, multiple read thresholds may be relied upon to read the same bits of a memory cell. A single bit, stored in a memory cell, may thus be read repeatedly, using these multiple thresholds. With each read operation, a different read result may be obtained. For example, using a first read threshold, a bit value "1" may be obtained, whereas using a second read threshold, a bit value "0" may be obtained. Each of these obtained bit values may have an associated confidence level, indicating the likeliness that they are correct. Confidence levels (416) may thus be included in the decoding parameters (412). A description of the decoding parameters (412) is provided below, with reference to FIG. 5.

In one embodiment of the technology, the decoding scheme (418) is selected in conjunction with the read threshold value(s) (414). The decoding scheme (418) may further consider the confidence levels (416). A decoding scheme may be based on an error correcting code (ECC) that operates on a series of bits obtained from performing read operations and verifies the correctness of these bits (e.g., based on redundancies in the series of bits), and corrects bits that are detected as incorrect. A series of bits may be, for example, a four kilobyte code word, where the bits of the code word are obtained from memory cells. The decoding algorithm may be any kind of decoding algorithm, including Hamming, Reed-Solomon, Bose-Chaudhuri-Hocquenghem (BCH), and low-density parity check (LDPC) codes, without departing from the technology and/or any other hard or soft decoding algorithm as further described below.

In one embodiment of the technology, the read threshold value(s) (414) are ascertained by conducting experiments to determine how the read threshold values should be modified when at least one of the following variables is modified: retention time, P/E cycle value, and page number. The read threshold value(s) (414) is optimized in order to be able to successfully read data from a solid-state memory module. Specifically, for each combination of <retention time, P/E cycle value, page number>, optimal read threshold values are determined. The optimal read threshold value for a given <retention time, P/E cycle value, page number> are the read threshold value for which bits read from the memory cells are particularly suitable as inputs to the decoder, increasing the likeliness that the decoder can reconstruct the correct bit sequence.

Similarly, the confidence levels (416) may also be based on a characterization of the solid state memory and/or the specific implementation of the ECC decoder on the controller. Depending on the degree of certainty with which bit values can be determined when reading the solid state memory, a higher or a lower confidence level may be used.

Depending on the retention time, the P/E cycle value and the page number, the read threshold values (414) and/or they confidence levels (416) may differ and change over time.

By modifying the read threshold value(s) (414) and/or the confidence levels (416) based upon retention time, P/E cycle value, and page number, the storage appliance takes into account the various variables that may alter the voltage stored in a given memory cell at a given retention time, P/E cycle value, and page number. Said another way, when the logical value "0 is to be stored in a memory cell, the storage module controller stores a sufficient number of electrons in the memory cell in order to have a voltage that corresponds to "0". Over time, the voltage stored in the memory cell varies based upon the retention time, P/E cycle value, and page number. By understanding how the voltage varies over time based on the above variables, an appropriate read threshold value and confidence level may be used when reading the logical value from the memory cell in order to retrieve "0".

For example, a particular read threshold value may be used and a particular confidence level may be assumed to successfully read data when the retention time is 4 months, the P/E cycle value is 30,000, and the page number is 3. Later, when the retention time is 5 months, a different read threshold value may be used, and a lower confidence level may be assumed when reading the data.

Figure 5A:
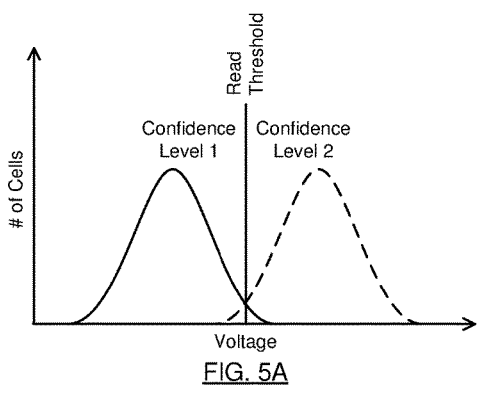
FIGS. 5A-5C show exemplary read thresholds in accordance with one or more embodiments of the technology.
Figure 5B:
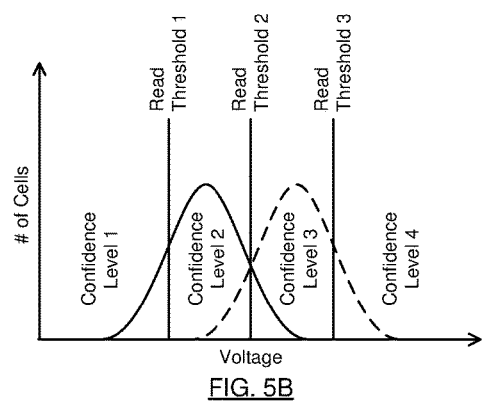
Figure 5C:
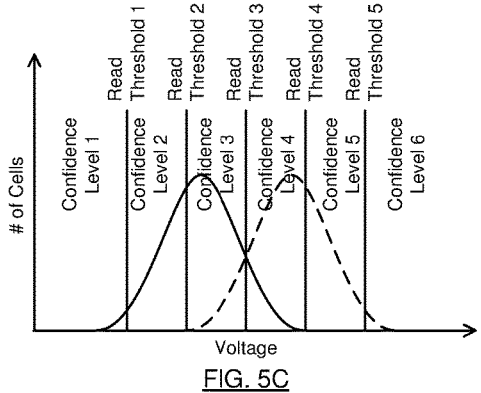

FIGS. 5A-5C show exemplary read thresholds in accordance with one or more embodiments of the invention. These read thresholds are placed relatively to exemplary voltage level distributions as they may be observed in a large number of hypothetical memory cells, after programming. The graphs in FIGS. 5A-5C show voltage levels of SLC memory cells, i.e., memory cells that may be used to store two voltage levels. Each of these voltage levels, programmed into many memory cells, in FIGS. 5A-5C, is represented by a distribution. The voltage level distribution for the bit value "0" is represented by the solid curve and the voltage level distribution for the bit value "1" is represented by the dashed curve. As illustrated in FIGS. 5A-5C, the programming of a particular voltage into multiple memory cells thus not necessarily result in exact, reproducible memory cell voltages, as indicated by the voltage level distributions.

Turning to FIG. 5A, a read threshold is placed centrally between the two voltage level distributions. When a read operation is performed, the actual voltage obtained from the memory cell is compared to the read threshold. If the actual voltage falls below the read threshold, the actual voltage is assumed to represent a "0" bit value. If the actual voltage falls above the read threshold, the actual voltage is assumed to represent a "1" bit value. The read threshold separates the range of possible memory cell voltages into two regions. Each region may be assigned a confidence level for the correctness of the obtained interpretation of the measured voltage. Assume, for example, two voltage level distributions that are entirely non-overlapping, and a read threshold that is placed between the two voltage level distributions. In this case, the confidence level with which a "0" can be distinguished from a "1", based on the measured voltage, would be the highest. In contrast, consider the overlapping voltage level distributions of FIG. 5A. In the region of overlap, a voltage is ambiguous, i.e., it may represent the bit value "0" or "1". Accordingly, the confidence levels associated with the overlapping voltage level distributions in FIG. 5A are below the highest value For example, if a voltage is found to be below the read threshold, the probability of the obtained voltage representing the bit value "0" may be less than 100%. If the voltage level distributions overlap more significantly, the confidence level may further reduce. Confidence levels may be reported, for example, as a log-likelihood ratio (LLR), or in any other format.

In one embodiment of the technology, the LLR is a function of the obtained voltage range and defined by the log of the ratio between the probability of the obtained voltage given the bit value "0" was programmed and the probability of the obtained voltage given the bit value "1" was programmed (i.e., $LLR(v)=\log(Pr(v|"0")/Pr(v|"1"))$. In various implements of the technology, if the LLR is used then if there is a high level of confidence that "0" was programmed, then LLR will have a high positive value. Further, if there is a high level of confidence that "1" was programmed, then the LLR will have a negative value with a large magnitude. However, if it is equally likely that either "0" or "1" have been programmed, then the LLR will be 0.

Turning to FIG. 5B, three read thresholds are placed to read from memory cells. Accordingly, three read operations may be performed. In each of the read operations, the actual voltage obtained from the memory cell is compared to the selected read threshold. If the actual voltage falls below the read threshold, the actual voltage is assumed to represent a "0" bit value. If the actual voltage falls above the read threshold, the actual voltage is assumed to represent a "1" bit value. Depending on in what region of the range of possible cell voltages the voltage was measured, a different confidence level may be assigned to the interpretation of the measured voltage. For example, to the left of read threshold 1, the confidence that a measured voltage represents a "1 bit value is very high, whereas it is very unlikely that a measured voltage represents a "0 bit value. Between read thresholds 1 and 2, it is still significantly more likely that a measured voltage represents a "1 bit value rather than a "0 bit value. Between read thresholds 2 and 3, the confidence levels are reversed, i.e., it is significantly more likely that a measured voltage represents a "0 bit value rather than a "1 bit value. Finally, in the region to the right of read threshold 3, the confidence that a measured voltage represents a "0 bit value is very high, whereas it is very unlikely that a measured voltage represents a "1" bit value. Consider the specific example in which a memory cell voltage is located in the region between read threshold 1 and read threshold 2. Further, assume the following confidence levels for the four confidence regions: (i) to the left of read threshold 1, bit value "0": 90%, bit value "1": 10% (e.g., the LLR may be a large positive value such as +15); (ii) between read thresholds 1 and 2, bit value "0": 60%, bit value "1": 40% (e.g., the LLR may be a small positive value such as +3); (iii) between read thresholds 2 and 3, bit value "0": 40%, bit value "1": 60% (e.g., the LLR may be a small negative value such as −3); (iv) to the right of read threshold 3, bit value "0": 10%, bit value "1": 90% (e.g., the LLR may be a large negative value such as −15). When performing the first read operation, using read threshold 1, it is determined that (because the memory cell voltage is above read threshold 1) the memory cell represents the bit value "1" with a 40% confidence. When performing the second read operation, using read threshold 2, it is determined that (because the memory cell voltage is below read threshold 2) the memory cell represents the bit value "0" with a 60% confidence. Further, when performing the third read operation, using read threshold 3, it is determined that (because the memory cell voltage is below read threshold 3) the memory cell represents the bit value "0" with a 40% confidence. After the three aforementioned read operations are performed, a determination may be made as to which of the four voltage regions the memory cell belongs. This information may then be used to determine a confidence level (e.g., expressed as an LLR) for each bit location.

After the repeated read operations have been performed, the decoding scheme may be applied to the obtained bit values to extract the decoded bit value. If decoded correctly, the decoded bit value corresponds to the bit value that was originally written into the memory cell. The decoding scheme may further rely on the confidence levels obtained for the bit values to further increase the likeliness of a successful, i.e. correct, decode. The decoding scheme may, thus, accept the confidence levels as additional inputs, or alternatively is preconfigured with the confidence levels. In one embodiment of the technology, a decoder (e.g., an ECC decoder) operates on data obtained from many memory cells. The data from these memory cells may include redundancies that enable reconstruction of faulty bits. The decoding maybe performed, for example on 4-8K of data. If three read thresholds are used, as described in the example of FIG. 5B, 3×4-8 k of data are processed by the decoder in order to obtain the 4-8 k decoded data.

Turning to FIG. 5C, five read thresholds are placed to read from memory cells. Accordingly, five read operations may be performed, with a higher granularity of the confidence levels, in comparison to FIG. 5B. Those skilled in the art will recognize that any number of read thresholds may be used and any confidence levels may be assigned to the resulting confidence regions, without departing from the invention. Typically, if N read thresholds are used, N+1 confidence levels may be available. For example, in FIG. 5C, the use of five read thresholds results in the availability of six confidence levels.

While FIGS. 5A-5C illustrate the use of read thresholds in SLC memory, the read thresholds may be used in other memory, e.g. MLC memory as well, without departing from the technology.

In one embodiment of the technology, a decision regarding the number and the location of the read threshold(s) and the corresponding confidence levels may be made based on a characterization of the solid state memory. For example, a higher number of read thresholds may be assigned to solid state memory where the characterization indicates a higher degree of voltage level distribution overlap, whereas fewer thresholds may be assigned to solid state memory with less overlap. Similarly, the confidence levels may be determined based on how unambiguously a "0" and a "1" bit value can be read from the memory cell. The characterization of the solid state memory may involve repeated read and/or write operations, modeling, simulation and/or statistical analysis.

In one embodiment of the technology, the read threshold value(s) (414) and the confidence levels (416), as shown in FIGS. 5A-5C, as well as the decoding scheme (418) are ascertained by conducting characterizations to determine how the read threshold values and the decoding scheme should be modified when at least one of the following variables is modified: retention time, P/E cycle value, and page number. The read threshold value(s) (414), the confidence levels (416) and the decoding scheme (418) are optimized in order to be able to successfully reconstruct data from a solid-state memory module, by first reading voltages of memory cells in the solid-state memory, assigning bit values and confidence levels, based on the voltages, and then processing these bit values and confidence levels by the decoding algorithm to detect and correct potential errors in the bit values. For each combination of <retention time, P/E cycle value, page number> an optimal read threshold value and an optimal decoding scheme is determined. Further, confidence levels may also be determined. The optimal combination of read threshold values, and decoding scheme for a given <retention time, P/E cycle value, page number> is the combination of read threshold values and decoding scheme that maximizes decoding performance (including minimizing bit errors and/or minimizing the processing power required for the decoding) for a given retention time of the data, P/E cycle value of the physical location on which the data is stored, and the page number of the page on which the data is stored in the solid-state memory module. The decoding scheme may or may not consider confidence levels. Accordingly, the decoding scheme, the number of voltage threshold values, the voltage threshold values and the confidence levels that are used in an actual read operation may be specific to the combination of <retention time, P/E cycle value, page number> and may change as the retention time, P/E cycle value and/or page number changes.

By modifying the read threshold value(s) the confidence levels and/or the decoding scheme based upon retention time, P/E cycle value, and page number, the storage appliance takes into account the various variables that may alter the voltage stored in a given memory cell at a given retention time, P/E cycle value, and page number. Said another way, when the logical value "1" is to be stored in a memory cell, the storage module controller stores a sufficient number of electrons in the memory cell in order to have a voltage that corresponds to "1". Over time, the voltage stored in the memory cell varies based upon the retention time, P/E cycle value, and page number. By understanding how the voltage varies over time based on the above variables, an appropriate read threshold value may be used when reading the logical value from the memory cell in order to retrieve "1".

For example, a first read threshold value(s) may be used to successfully read data when the retention time is 4 months, the P/E cycle value is 30,000, and the page number is 3, while a second read threshold value(s) may be used to successfully read data when the retention time is 5 months, the P/E cycle value is 30,000, and the page number is 3. Similarly a different, more sophisticated decoding scheme may be relied upon as the P/E cycle value increases and/or as the retention time increases. This more sophisticated decoding scheme may require the use of additional read thresholds.

If the default read threshold value and/or a standard decoding scheme is used (instead of the identified preferred read threshold values and/or decoding scheme), then there is a higher likelihood that an incorrect logical value (e.g., "0" instead of "1") may be obtained from reading the memory cell. This, in turn, results in the need for other error correction mechanisms such as RAID reconstruction (i.e., correction of errors within retrieved data using one or more parity values) in order to correct the error in the retrieve data and ultimately provide error-free data to the requesting client. The use of these additional error correction mechanisms increases the time required to service a client read request and consequently decreases the performance of the storage appliance.

In one embodiment of the technology, a read threshold value(s), confidence levels and/or a decoding scheme may be provided for each <retention time, P/E cycle value, and page number> combination. The specific read threshold value(s), confidence levels and/or the decoding scheme may correspond to default or non-default read threshold value(s), confidence levels and/or decoding scheme.

In another embodiment of the technology, memory (210 in FIG. 2) only stores a non-default read threshold value(s), confidence levels and/or decoding scheme for each <retention time, P/E cycle value, and page number> combination. In this scenario, a non-default read threshold value(s), confidence levels and/or decoding scheme are associated with a given <retention time, P/E cycle value, and page number> combination when using the non-default read threshold value(s), confidence levels and/or decoding scheme results in a higher percentage of error-free data being read from the solid-state memory module versus using the default read threshold value(s), confidence levels and/or decoding scheme. Further, in this scenario, no default read threshold value(s), confidence levels and/or decoding scheme are stored for any <retention time, P/E cycle value, and page number> combination when using the default read threshold value(s), confidence levels and/or decoding scheme results in a higher percentage of error-free data being read from the solid-state memory module versus using the non-default read threshold value(s), confidence levels and/or decoding scheme.

Turning to the flowcharts, while the various steps in the flowchart are presented and described sequentially, one of ordinary skill will appreciate that some or all of the Steps may be executed in different orders, may be combined or omitted, and some or all of the steps may be executed in parallel.

Figure 6A:
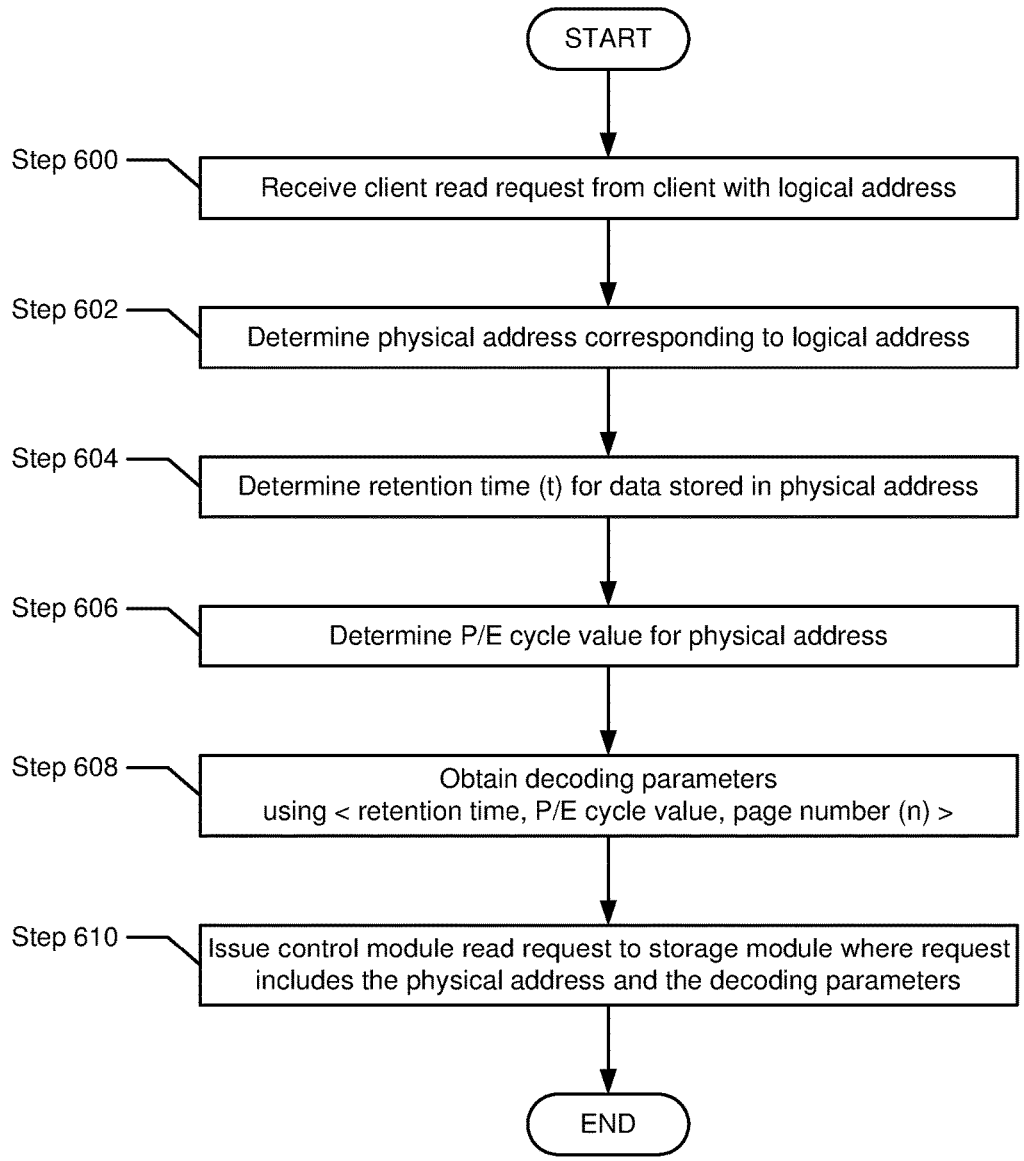
FIGS. 6A and 6B show methods for reading data from a storage module in accordance with one or more embodiments of the technology.

FIG. 6A shows a method for processing client read requests by a storage appliance in accordance with one or more embodiments of the technology. Prior to the execution of the method of FIG. 6A, a characterization of the solid state memory to be targeted by the read operation(s) has been performed. As a result of the characterization, read threshold values, confidence levels and decoding schemes have been determined for the combinations of <retention time, page number, P/E cycle value>.

In Step 600, a client read request is received by the control module from a client, where the client read request includes a logical address.

In Step 602, a physical address (which includes the page number) is determined from the logical address. As discussed above, the memory in the control module includes a mapping of logical addresses to physical addresses (see discussion of FIG. 4, 400, 402). In one embodiment of the technology, the physical address is determined by performing a look-up (or query) using the mapping of logical addresses to physical addresses along with the logical address obtained from the client request in Step 600.

In Step 604, the retention time (t) is determined for the data stored at the physical address. The retention time may be determined using the birth time of the data (see e.g., FIG. 4, 408) and the time of the client request (e.g., the time the client issued the client request, the time the client request was received by the storage appliance, etc.). The birth time of the data is obtained from the memory (e.g., FIG. 2, 210) of the control module. The retention time may be calculated by determining the difference between the time of the client request and the birth time.

In Step 606, the P/E cycle value for the physical address is determined. The P/E cycle value may be determined by performing a look-up in an in-memory data structure (located in the memory of the control module) using the physical address as the key. The result of Step 506 may be the actual P/E cycle value associated with the physical address (e.g., the P/E cycle value associated with the block in which the physical location corresponding to the physical address is located) or may be a P/E cycle value range (e.g., 5,000-9,999 P/E cycles), where the actual P/E cycle value associated with the physical address is within the P/E cycle value range.

In Step 608, zero or more read threshold values, confidence levels and the decoding scheme to be used for the read operation are obtained from an in-memory data structure (see FIG. 4, 410, 412) using the following key <retention time, P/E cycle value, and page number>. In one embodiment of the technology, in Step 608 no read threshold values, confidence levels and/or decoding schemes may be obtained when the default read threshold value(s), confidence levels and/or decoding scheme is to be used by the storage module controller to read data from the physical address. As discussed above, the default read threshold value(s), confidence levels and/or decoding schemes are used when they result in a higher read performance (e.g., a higher percentage of error-free data (i.e., data with no bit errors) and/or faster read operations) versus using the non-default read threshold value(s), confidence levels and/or decoding scheme. In one embodiment of the technology, non-default threshold values, confidence levels and/or decoding scheme (see FIG. 4, 412) may be obtained. As discussed above, the non-default read threshold value(s), confidence levels and/or decoding scheme are used when using them results in a better read performance (e.g., a higher percentage of error-free data (i.e., data with no bit errors) and/or faster read operations) versus using the default read threshold value(s), confidence levels and/or decoding scheme.

In one embodiment of the technology, the determination of whether to use a non-default read threshold value, confidence levels and/or a non-default decoding scheme may be based on the P/E cycle value (determined in Step 606) and/or the retention time (determined in Step 604). For example, when the P/E cycle value is below a threshold P/E cycle value, the default read threshold value(s), confidence levels and/or the default decoding scheme may be used, and Step 608 may thus be skipped. Additionally or alternatively, when the retention time is below a threshold retention time, the default read threshold value(s), confidence levels and/or the default decoding scheme may be used, and Step 608 may thus be skipped. When the P/E cycle value (determined in Step 606) is above the threshold P/E cycle value and/or the retention time (determined in Step 504) is above the threshold retention time then the look-up described in Step 608 may be performed.

Continuing with the discussion in FIG. 6A, in Step 610, a control module read request is generated using the one or more read threshold value(s), confidence levels and/or the decoding scheme, obtained in Step 608, and the physical address. If there are no read threshold values, confidence levels and/or a decoding scheme obtained in Step 608, the control module request may (i) include no read threshold values, confidence levels and/or decoding scheme, or (ii) may include one or more default read threshold values, confidence levels and/or a decoding scheme, where the control module obtains the default read threshold values, confidence levels and/or the default decoding scheme in response to no read threshold values, confidence levels and/or decoding scheme having been obtained in Step 608. The format of the control module read request may be any format that is supported by the storage module controller.

In one embodiment of the technology, if there are multiple read threshold values associated with a given read request (e.g., see FIGS. 5B and 5C), then one or more of the aforementioned threshold values may correspond to the default read threshold value while other threshold values may correspond to non-default threshold values. Further, in scenarios in which there are multiple read threshold values, optionally, only the non-default threshold values may have been determined in Step 608.

Figure 6B:
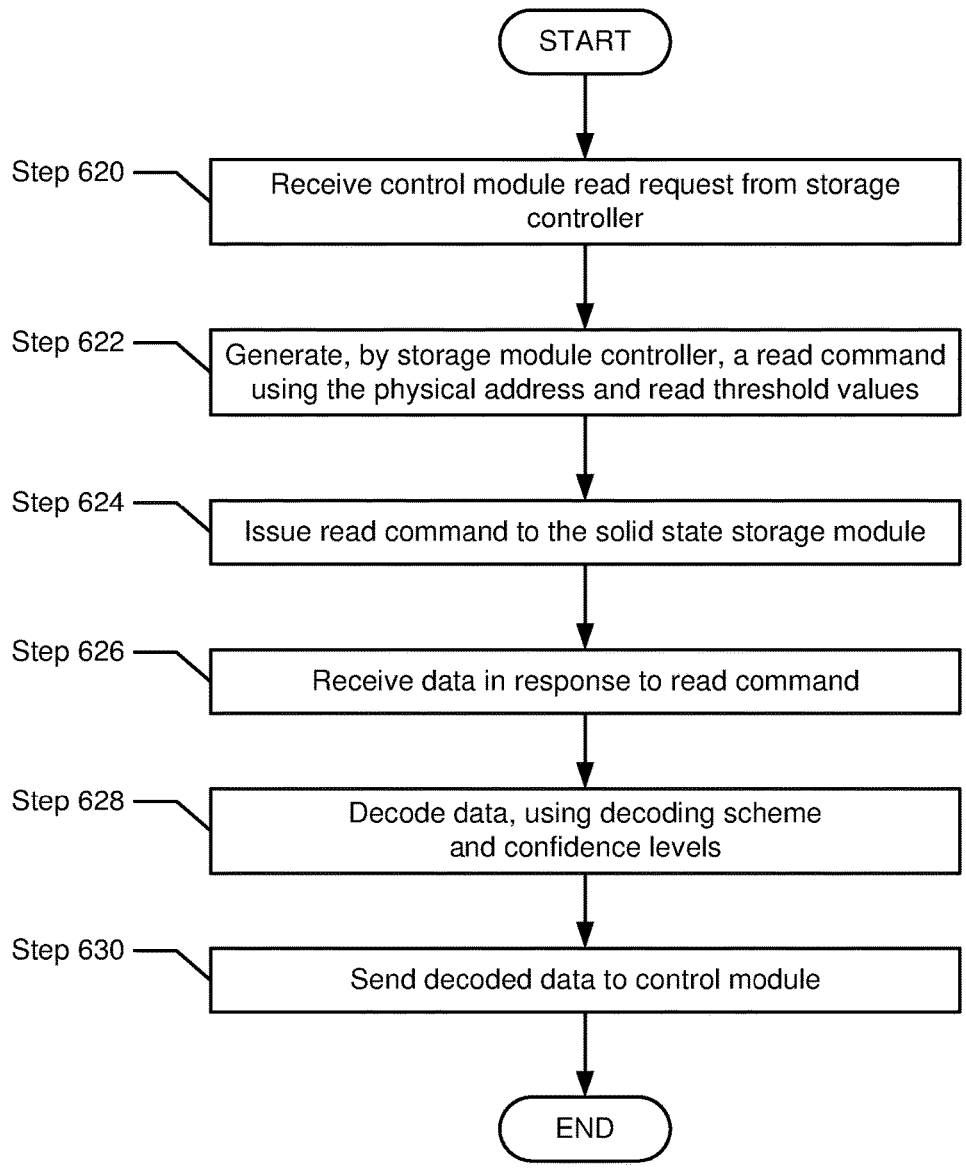

FIG. 6B shows a method for processing control module read requests in accordance with one or more embodiments of the technology. More specifically, FIG. 6B is performed by the storage module controller.

In Step 620, the control module read request is received from the control module. In Step 622, a read command is generated by the storage controller module based on the one or more read threshold value(s) and the physical address in the control module read request. In one embodiment of the technology any given read command generated in Step 622 may specify one or more read threshold values. If the control module does not include any read threshold values, then the default read threshold values are used to generate the read command. If the control module read request includes read threshold values that are in the form of shift values (described above), then generating the read command may include obtaining the default read threshold values and modifying one or more read threshold values using the shift value(s). The read command may be in any format that is supported by the solid-state memory modules.

In Step 624, the read command is issued to the solid-state memory module. Because the read command may include multiple read thresholds, the read command may instruct the solid-state memory module to read the same memory cells multiple times. For example, if three read thresholds are to be used, as illustrated in FIG. 5B, the same memory cells may be read three times. As previously described with reference to FIG. 5B, the reading of the same memory cells using different read thresholds may result in different data.

In Step 626, the data are received, by the storage module controller, in response to the read command. In Step 628, the data received in Step 626 are decoded. The decoding may be performed using a particular decoding scheme instructed by the read request received from the control module. The decoding scheme may operate on all data received in Step 626. If, for example, three data sets are received from the same memory cells that were read three times using different read thresholds, all three data sets may be processed by the decoding scheme to obtain the decoded data. The decoding scheme may further consider the confidence levels for the bits in the data sets and may, for example, perform a weighting of the bits in the data sets based on their associated confidence levels. Obtaining the decoded data may involve using redundancies in the data to check for erroneous bits, and a correction of the erroneous bits, if detected, as previously described.

In Step 630, the decoded data are provided to the control module. The control module subsequently provides the decoded data to the client. In one embodiment of the technology, the storage module controller may include functionality to directly transfer the retrieved data to the client without requiring the data to be temporarily stored in the memory on the control module.

Figure 7:
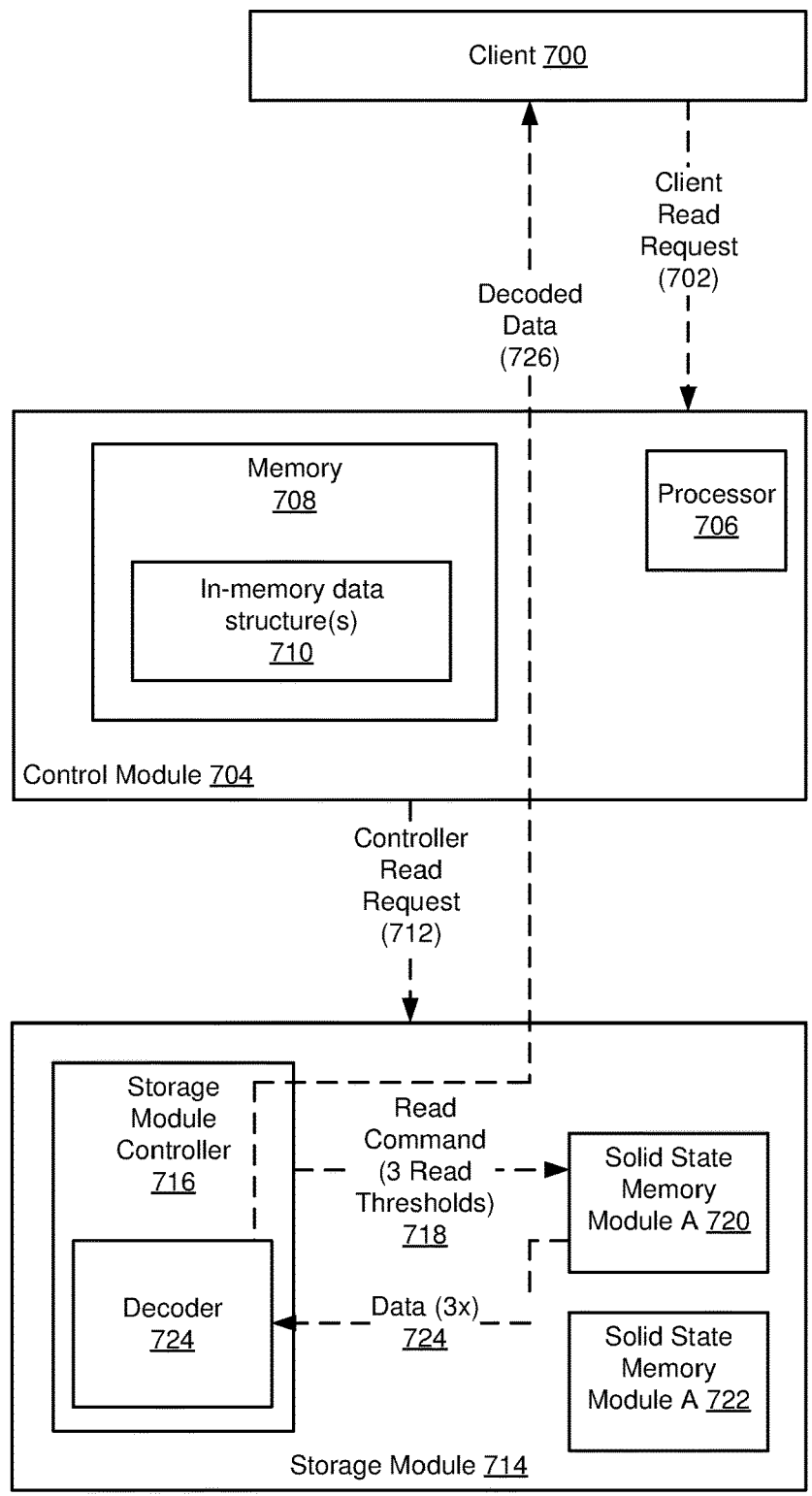
FIG. 7 shows an example in accordance with one or more embodiments of the technology.

FIG. 7 shows and example in accordance with one or more embodiments of the technology. The following example is not intended to limit the scope of the technology.

Turning to FIG. 7, consider a scenario in which a client (700) issues a client read request (702), which includes a logical address, to a storage appliance that includes a control module (704) and at least one storage module (714). The control module (704) receives the client read request and generates a controller read request (712) using the method described in FIG. 6A using the processor (706) and one or more in-memory data structures (710) stored in the memory (708) on the control module. More specifically, the control module, using one or more in-memory data structures (710), determines the physical address (PA) that corresponds to the logical address. Further, the control module, using one or more in-memory data structures (710) and the physical address, determines the birth time of the data stored at the physical address. The control module subsequently uses the birth time and the time that the client read request was received in order to determine the retention time of the data stored at the physical address. The control module then performs a look-up in an in-memory data structure(s) using the following index: <retention time, P/E cycle value, page number > in order to obtain at least one read threshold value, confidence levels and a decoding scheme, where the P/E cycle value is obtained from one of the in-memory data structures and the page number is extracted from the physical address. In the example, assume that three read thresholds are to be used.

In this example assume that the solid-state memory module (720, 722) includes SLCs and that the aforementioned look-up returns three read threshold values and four confidence levels as illustrated in FIG. 5B. The control module (704) subsequently generates a controller read request that includes the physical address, the three read threshold values, the four confidence levels and the decoding scheme. The controller read request (712) is subsequently issued to the storage module (714) that includes a solid-state memory module (720, 722) that includes the physical location corresponding to the physical address.

The storage module controller (716) subsequently receives and services the controller read request (712). More specifically, the storage module controller (716) generates and issues a read command (718) to the solid-state memory module that includes the physical location corresponding to the physical address. In this example, the read command is generated using the three read thresholds.

The decoder (724), executing the decoding scheme, subsequently receives the data from the solid-state memory module. The data includes three data sets obtained using the three read thresholds (i.e., one data set is obtained for each read threshold). The decoder applies the decoding scheme, under consideration of the four confidence levels, to the received three data sets and generates decoded data (726), and then provides the decoded data (726) to the client (700).

One or more embodiments of the technology may be implemented using instructions executed by one or more processors in the storage appliance. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for reading and decoding data from solid state memory, the method comprising:
   receiving a client read request for data from a client, wherein the client read request comprises a logical address;
   determining a physical address corresponding to the logical address, wherein the physical address comprises a page number for a physical page in the solid state memory;
   determining, using one selected from a group consisting of the physical address and the logical address, a retention time for the data;
   determining a program/erase (P/E) cycle value associated with the physical page;
   obtaining at least one read threshold value and a decoding scheme using the P/E cycle value, the retention time, and the page number;
   issuing a control module read request comprising the at least one read threshold value and the decoding scheme to a storage module, wherein the storage module comprises the physical page;
   obtaining the data from the physical page using the at least one read threshold value; and
   decoding the data obtained from the physical page using the decoding scheme.

2. The method of claim 1, further comprising:
   receiving a second client read request for second data from the client, wherein the second client read request comprises a second logical address;
   determining a second physical address corresponding to the second logical address, wherein the second physical address comprises a second page number for a second physical page in the solid state memory;
   determining, using one selected from a group consisting of the second physical address and the second logical address, a second retention time for the second data stored on the second physical page;
   determining a second P/E cycle value associated with the second physical page;
   obtaining the at least one read threshold value and a second decoding scheme different from the decoding scheme, using the second P/E cycle value, the second retention time, and the second page number;
   issuing a second control module read request comprising the at least one read threshold value and the second decoding scheme to the storage module, wherein the storage module comprises the second physical page, wherein the second physical page is distinct from the physical page;
   obtaining the second data from the second physical page using the at one read threshold value; and
   decoding the second data obtained from the second physical page using the second decoding scheme.

3. The method of claim 1, further comprising:
   receiving a second client read request for second data from the client, wherein the second client read request comprises a second logical address;
   determining a second physical address corresponding to the second logical address, wherein the second physical address comprises a second page number for a second physical page in the solid state memory;
   determining, using one selected from a group consisting of the second physical address and the second logical address, a second retention time for the second data stored on the second physical page;
   determining a second P/E cycle value associated with the second physical page;
   obtaining at least one second read threshold value different from the at least one read threshold value, and a second decoding scheme different from the decoding scheme, using the second P/E cycle value, the second retention time, and the second page number;
   issuing a second control module read request comprising the at least one second read threshold value and the second decoding scheme to the storage module, wherein the storage module comprises the second physical page, wherein the second physical page is distinct from the physical page;
   obtaining the second data from the second physical page using the at one second read threshold value; and
   decoding the second data obtained from the second physical page using the second decoding scheme.

4. The method of claim 1, further comprising:
   obtaining confidence levels associated with the at least one read threshold value using the P/E cycle value, the retention time, and the page number,
   wherein the issued control module read request further comprises the confidence levels, and
   wherein the decoding of the data is performed using the confidence levels.

5. The method of claim 1, wherein obtaining the data from the physical page using the at least one read threshold value comprises accessing a memory cell to read one data value for each of the read threshold values of the at least one read threshold values.

6. The method of claim 5, wherein the memory cell is one selected from a group consisting of a single-level cell (SLC) and a multi-level cell (MLC).

7. The method of claim 1, wherein the data obtained from the physical page comprises a plurality of data sets obtained from a set of memory cells using a plurality of read threshold values, wherein each data set of the plurality of data sets is obtained from the same set of memory cells using a particular read threshold value selected from the plurality of read threshold values.

8. The method of claim 7, wherein the decoding of the data obtained from the physical page comprises determining a final data set to send to the client, based on the plurality of data sets.

9. The method of claim 1, wherein obtaining the at least one read threshold value and the decoding scheme comprises performing a look-up in an in-memory data structure, wherein the in-memory data structure comprises a plurality of entries, wherein each of the plurality of entries comprises one of a plurality of read threshold values, one of a plurality of decode schemes, one of a plurality of P/E cycle values, and one of a plurality of retention times, and one of a plurality of page numbers.

10. The method of claim 1, further comprising, prior to receiving the client read request:
characterizing the solid state memory to establish a relationship between P/E cycle values, physical pages, retention times, read threshold values and decoding schemes; and
storing the relationship in an in-memory data structure.

11. The method of claim 1, wherein the decoding scheme is one selected from a group of hard threshold decoder and soft threshold decoder.

12. The method of claim 1, wherein the at least one read threshold value comprises a voltage value.

13. The method of claim 1, wherein the at least one read threshold value comprises a shift value, wherein the shift value corresponds to a voltage shift of a default read threshold value.

14. A system, comprising:
a storage module comprising a storage module controller and persistent storage; and
a control module operatively connected to the storage module and a client,
wherein the control module:
receives a client read request for data from a client, wherein the client read request comprises a logical address;
determines a physical address corresponding to the logical address, wherein the physical address comprises a page number for a physical page in the persistent storage;
determines, using one selected from a group consisting of the physical address and the logical address, a retention time for the data;
determines a program/erase (P/E) cycle value associated with the physical page;
obtains at least one read threshold value and a decoding scheme using the P/E cycle value, the retention time, and the page number; and
issues a control module read request comprising the at least one read threshold value and the decoding scheme to a storage module, wherein the storage module comprises the physical page,
wherein the storage module:
receives the control module read request;
obtains the data from the physical page using the at least one read threshold value; and
decodes the data obtained from the physical page using the decoding scheme.

15. The system of claim 14,
wherein the control module further:
receives a second client read request for second data from the client, wherein the second client read request comprises a second logical address;
determines a second physical address corresponding to the second logical address, wherein the second physical address comprises a second page number for a second physical page in the persistent storage;
determines, using one selected from a group consisting of the second physical address and the second logical address, a second retention time for the second data stored on the second physical page;
determines a second P/E cycle value associated with the second physical page;
obtains the at least one read threshold value and a second decoding scheme different from the decoding scheme, using the second P/E cycle value, the second retention time, and the second page number;
issues a second control module read request comprising the at least one read threshold value and the second decoding scheme to the storage module, wherein the storage module comprises the second physical page, wherein the second physical page is distinct from the physical page; and
wherein the storage module:
receives the second control module read request;
obtains the second data from the second physical page using the at one read threshold value; and
decodes the second data obtained from the second physical page using the second decoding scheme.

16. The system of claim 14,
wherein the control module further:
receives a second client read request for second data from the client, wherein the second client read request comprises a second logical address;
determines a second physical address corresponding to the second logical address, wherein the second physical address comprises a second page number for a second physical page in the persistent storage;
determines, using one selected from a group consisting of the second physical address and the second logical address, a second retention time for the second data stored on the second physical page;
determines a second P/E cycle value associated with the second physical page;
obtains at least one second read threshold value different from the at least one read threshold value, and a second decoding scheme different from the decoding scheme, using the second P/E cycle value, the second retention time, and the second page number;
issues a second control module read request comprising the at least one second read threshold value and the second decoding scheme to the storage module, wherein the storage module comprises the second physical page, wherein the second physical page is distinct from the physical page; and
wherein the storage module:
receives the second control module read request;
obtains the second data from the second physical page using the at one second read threshold value; and
decodes the second data obtained from the second physical page using the second decoding scheme.

17. The system of claim 14, wherein the control module further:
- obtains confidence levels associated with the at least one read threshold value using the P/E cycle value, the retention time, and the page number, and
- wherein the issued control module read request further comprises the confidence levels, and
- wherein the decoding of the data is performed using the confidence levels.

18. The system of claim 14, wherein the data obtained from the physical page comprises a plurality of data sets obtained from a set of memory cells using a plurality of read threshold values,
- wherein each data set of the plurality of data sets is obtained from the same set of memory cells using a particular read threshold value selected from the plurality of read threshold values.

19. The system of claim 18, wherein the decoding of the data obtained from the physical page comprises determining a final data set to send to the client, based on the plurality of data sets.

20. A non-transitory computer readable medium comprising computer readable program code, which when executed by a computer processor enables the computer processor to:
- receive a client read request for data from a client, wherein the client read request comprises a logical address;
- determine a physical address corresponding to the logical address, wherein the physical address comprises a page number for a physical page in solid state memory;
- determine, using one selected from a group consisting of the physical address and the logical address, a retention time for the data;
- determine a program/erase (P/E) cycle value associated with the physical page;
- obtain at least one read threshold value and a decoding scheme using the P/E cycle value, the retention time, and the page number;
- issue a control module read request comprising the at least one read threshold value and the decoding scheme to a storage module, wherein the storage module comprises the physical page;
- obtain the data from the physical page using the at least one read threshold value; and
- decode the data obtained from the physical page using the decoding scheme.

* * * * *

UNITED STATES PATENT AND TRADEMARK OFFICE
CERTIFICATE OF CORRECTION

| | | |
|---|---|---|
| PATENT NO. | : 10,290,331 B1 | Page 1 of 1 |
| APPLICATION NO. | : 15/581191 | |
| DATED | : May 14, 2019 | |
| INVENTOR(S) | : Seungjune Jeon | |

It is certified that error appears in the above-identified patent and that said Letters Patent is hereby corrected as shown below:

In the Claims

Column 16, Line 16, in Claim 2, the phrase "using the at one read threshold value" should read -- using the at least one read threshold value --.

Column 16, Line 44, in Claim 3, the phrase "using the at one second threshold value" should read -- using the at least one second threshold value --.

Column 17, Line 16-18, in Claim 9, the phrase "cycle values, and one of a plurality of retention times, and one of a plurality of page" should read -- cycle values, one of a plurality of retention times, and one of a plurality of page --.

Column 18, Line 30, in Claim 15, the phrase "using the at one read threshold value" should read -- using the at least one read threshold value --.

Column 18, Line 65, in Claim 16, the phrase "using the at one second read threshold value" should read -- using the at least one second read threshold value --.

Signed and Sealed this
Third Day of September, 2019

Andrei Iancu
*Director of the United States Patent and Trademark Office*